United States Patent
Hirokawa

(10) Patent No.: US 6,340,792 B1
(45) Date of Patent: *Jan. 22, 2002

(54) MOLD CAP FOR SEMICONDUCTOR DEVICE MOLD PACKAGE

(75) Inventor: Tomoaki Hirokawa, Tokyo (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/841,573

(22) Filed: Apr. 30, 1997

(51) Int. Cl.[7] .............................................. H01L 23/02
(52) U.S. Cl. ...................... 174/52.4; 257/704; 257/693
(58) Field of Search ............................. 174/52.5, 52.4; 257/704, 678, 701, 687, 693

(56) References Cited

U.S. PATENT DOCUMENTS

| 4,369,330 A | * | 1/1983 | Pilz | 174/52.3 |
| 4,541,003 A | * | 9/1985 | Otsuka et al. | 257/704 |
| 4,839,716 A | * | 6/1989 | Butt | 257/704 |
| 5,105,260 A | * | 4/1992 | Butera | 257/668 |
| 5,436,492 A | * | 7/1995 | Yamanaka | 257/433 |

FOREIGN PATENT DOCUMENTS

JP 58164230 9/1983

* cited by examiner

Primary Examiner—Dean A. Reichard
Assistant Examiner—Hung V Ngo
(74) Attorney, Agent, or Firm—Sughrue Mion, PLLC

(57) ABSTRACT

In a semiconductor device mold package composed of a mold cap and a mold case both of which are formed of a resin compound and which are joined to each other to form a hollow inner space defined and encapsulated by the mold cap and the mold case, the mold cap has a recess defined by an inner wall surface and surrounded by a flat mouth portion, for the purpose of forming the above mentioned hollow inner space. The mold cap is constructed to fulfill a relation of $a-b \geq t$ and $a-b \leq b$ where "a" is a height from the mouth portion to a top of an outer wall surface, "b" is a height from the mouth portion to a top of the inner wall surface, and "t" is a thickness of the mold cap at the mouth portion.

9 Claims, 3 Drawing Sheets

MOLD CAP FOR SEMICONDUCTOR DEVICE MOLD PACKAGE

BACKGROUND OF THE INVENTION

1. Field of the Invention

The present invention relates to a mold cap for a semiconductor device mold package, and more specifically to a mold cap for a semiconductor device mold package composed of the mold cap and a mold case both of which are formed of a resin compound and which are joined to each other to form an inner hollow space defined and encapsulated by the mold cap and the mold case.

2. Description of Related Art

Referring to FIG. 1, there is shown a diagrammatic sectional view of a mold cap for a semiconductor device mold package, which is disclosed by Japanese Patent Application Pre-examination Publication No. JP-A-58-164230, an English abstract of which is published from the Japanese Patent Office. The content of the English abstract of JP-A-58-164230 is incorporated by reference in its entirety into this application.

In the shown mold cap generally designated with Reference Numeral 3, since a design of an outer wall height "a" and a mold cap resin thickness "t" have not been considered when the mold cap is designed, various problems have been encountered because of a thermal stress generated in the mold cap 3 in the process for assembling and bonding the mold cap and a mold case (not shown) to accommodate a semiconductor chip (not shown) in an inner space defined and encapsulated between the mold cap and the mold case. A first problem is that, because of the thermal stress, the mold cap 3 notably deforms in shape, so that a crack often occurs in the mold cap 3 or a bond strength between the mold cap and the mold case significantly drops. A second problem is that, when an ambient temperature elevates, a gas encapsulated in the inner hollow space of the semiconductor device mold package expands, so that the mold cap 3 is often blown away.

The cause for the above mentioned problems are considered as follows:

A cause for the first problem is considered as follows: Since there is a considerable difference between an outer wall surface length "Lout" (=2a+W) and an inner wall surface length "Lin", a difference occurs in a linear expansion length between the outer wall surface length "Lout" and the inner wall surface length "Lin" due to temperature variation. Specifically, when the ambient temperature drops, the mold cap 3 deforms to open a mouth of the mold cap. To the contrary, when the ambient temperature elevates, the mold cap 3 deforms to close or purse the mouth of the mold cap.

A cause for the second problem is considered as follows: When the ambient temperature elevates, the pressure of the gas encapsulated in the inner hollow space of the semiconductor device mold package, increased by the ambient temperature elevation, becomes superior to the bond strength of the mold cap.

SUMMARY OF THE INVENTION

Accordingly, it is an object of the present invention to provide a mold cap for a semiconductor device mold package, which has overcome the above mentioned defects of the conventional one.

Another object of the present invention is to provide a mold cap for a semiconductor device mold package, and configured to minimize the deform of the mold cap caused by the thermal stress, thereby to prevent generation of a crack in the mold cap.

Still another object of the present invention is to provide a mold cap for a semiconductor device mold package, and configured to minimize the expansion of the gas encapsulated in the package inner hollow space, caused by the ambient temperature elevation, thereby to prevent the mold cap from being blown away.

The above and other objects of the present invention are achieved in accordance with the present invention by a mold cap for a semiconductor device mold package composed of the mold cap and a mold case both of which are formed of a resin compound and which are joined to each other to form a hollow inner space defined and encapsulated by the mold cap and the mold case, the mold cap having a recess defined by an inner wall surface and surrounded by a mouth portion, a height from the mouth portion to a top of an outer wall surface being defined as "a", a height from the mouth portion to a top of the inner wall surface being defined as "b", and a thickness of the mold cap at the mouth portion being defined as "t", and the mold cap being constructed to fulfill a relation of a-b≧t and a-b≦b.

In an embodiment of the mold cap, the inner wall surface of the mold cap is shaped to draw a quadrilaterals, for example, a rectangle, in a vertical section passing through a center of the mold cap, and the outer wall surface of the mold cap is shaped also to draw a quadrilaterals, for example, a rectangle, in the vertical section passing through the center of the mold cap. Specifically, in a bottom view, the mouth portion has an outer contour in the form of a circle, and an inner contour in the form of a circle, so that the mold cap is in a cylindrical form, and the inner wall surface confines a recess in a cylindrical form.

Alternatively, the inner wall surface of the mold cap is shaped to draw a smoothed curve line, such as a portion of a circle or an ellipse, in a vertical section passing through a center of the mold cap, and the outer wall surface of the mold cap is shaped to draw a quadrilaterals such as a rectangle in the vertical section passing through the center of the mold cap. Specifically, in a bottom view, the mouth portion has an outer contour in the form of a circle, and an inner contour in the form of a circle, so that the mold cap is in a cylindrical form, and the inner wall surface confines a recess in a partial spherical body form, for example as one obtained by rotating a partial circle or ellipse defined by an arc and a chord joining the ends of the arc, around an axis passing though a center of the chord perpendicularly to the chord. Preferably, the outer wall surface has a chamfered corner in the vertical section passing through the center of the mold cap.

The above and other objects, features and advantages of the present invention will be apparent from the following description of preferred embodiments of the invention with reference to the accompanying drawings.

DESCRIPTION OF THE PREFERRED EMBODIMENTS

Figure 2:
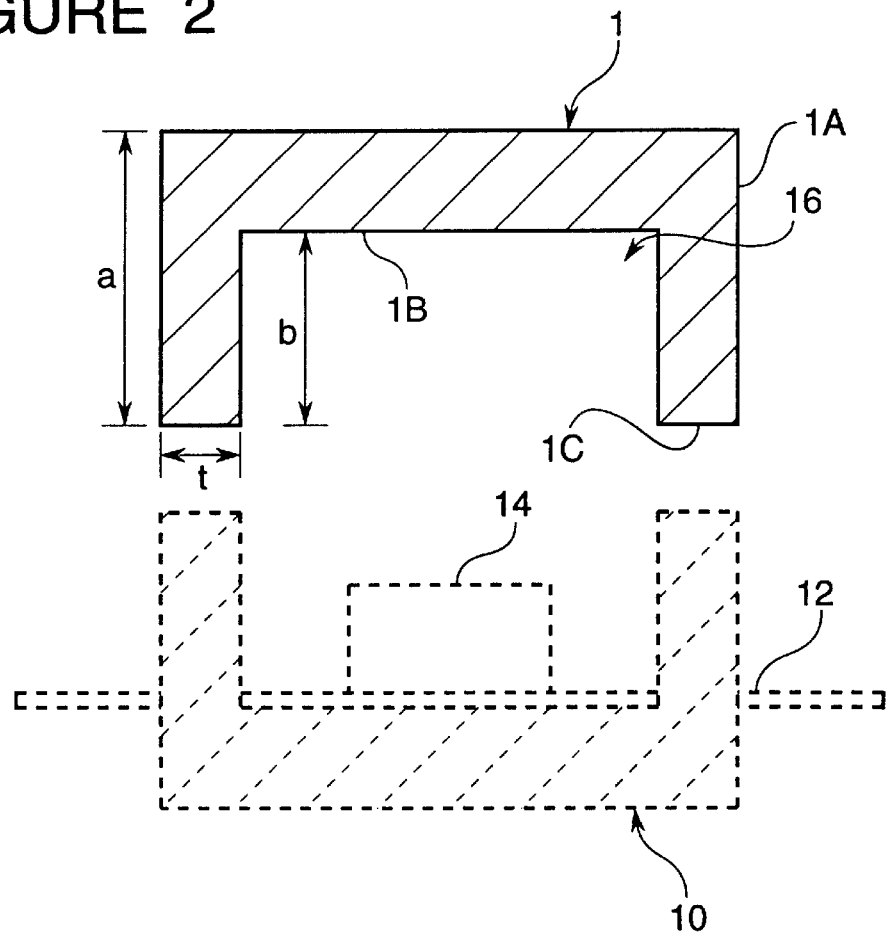
FIG. 2 is a diagrammatic vertical sectional view, taken along the line II—II in FIG. 2A, of a first embodiment of the mold cap in accordance with the present invention for a semiconductor device mold package.
Figure 2A:
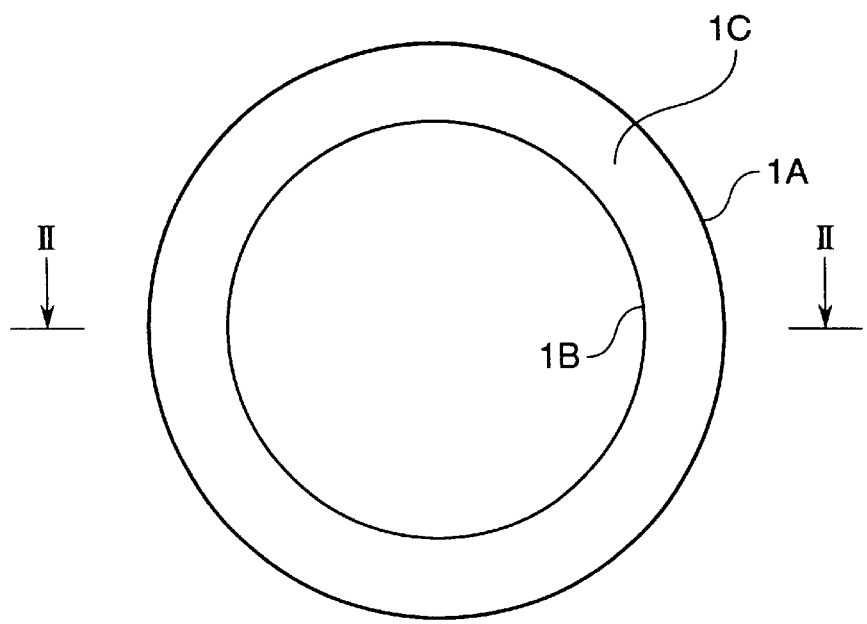
FIG. 2A is a diagrammatic bottom view of the first embodiment of the mold cap shown in FIG. 2.

Referring to FIG. 2, there is shown a diagrammatic vertical sectional view, taken along the line II—II in FIG. 2A passing through a center of the mold cap, of a first embodiment of the mold cap in accordance with the present invention for a semiconductor device mold package. FIG. 2A is a diagrammatic bottom view of the first embodiment of the mold cap shown in FIG. 2.

The mold cap is shaped to draw a quadrilaterals in a vertical section passing through a center of the mold cap, and a circle or an ellipse in a bottom view, and has a downward open recess. In the vertical section, an outer wall surface of the mold cap draws a quadrilaterals, and an inner wall surface of the mold cap also draws a quadrilaterals.

In the shown embodiment, the mold cap is generally designated with Reference Numeral 1, and is shaped to draw a rectangle in a vertical section passing through a center of the mold cap, as shown in FIG. 2 and a circle in a bottom view, as shown in FIG. 2A. More specifically, in the vertical section shown in FIG. 2, an outer wall surface 1A (outer top surface and outer side surface) of the mold cap 1 draws three sides of a rectangle, and an inner wall surface 1B (inner bottom surface and inner side surface) of the mold cap 1 also draws a rectangle. The outer wall surface 1A and the inner wall surface 1B are joined at a flat bottom or a flat mouth portion 1C. In the bottom view shown in FIG. 2A, on the other hand, the flat mouth portion 1C has an outer contour in the form of a circle, and an inner contour in the form of a circle, which is coaxially to and is smaller than the circle of the outer contour of the flat mouth portion 1C. Thus, the inner wall surface 1B confines a recess in the form of a cylindrical body.

Here, it is defined that a height from the mouth portion 1C to a top of the outer wall surface 1A (namely, a height of the outer side surface) is "a", a height from the mouth portion 1C to a top of the inner wall surface 1B (namely, a height of the inner side surface) is "b", and a thickness of the mold cap at the mouth portion 1C is "t". The mold cap 1 is constructed and shaped to fulfill such a relation of a-b≧t and a-b≦b.

The mold cap 1 is used to be bonded with a mold case 10 shown in a ghost line in FIG. 2. This mold case 10 has the same configuration as that of the mold cap 1. A central portion of a lead frame 12 (shown in a ghost line in FIG. 2) supporting a semiconductor chip 14 (shown in a ghost line in FIG. 2) bonded thereon is located at a bottom of the mold case 10, and the lead frame 12 penetrates through a side wall of the mold case to extend horizontally and outwardly from the mold case 10. The mold cap 1 is bonded with the mold case 10 in such a manner that the mouth portion 1C of the mold cap 1 and a mouth portion of the mold case 10 are bonded to each other so as to locate the semiconductor chip 14 in an inner hollow closed space 16 defined and encapsulated by the mold cap 1 and the mold case 10.

Figure 1:
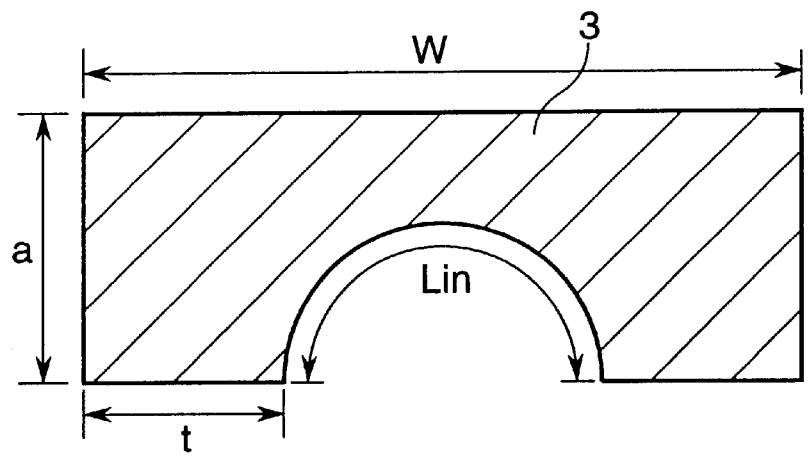
FIG. 1 is a diagrammatic vertical sectional view of a prior art mold cap for a semiconductor device mold package.
Figure 3:
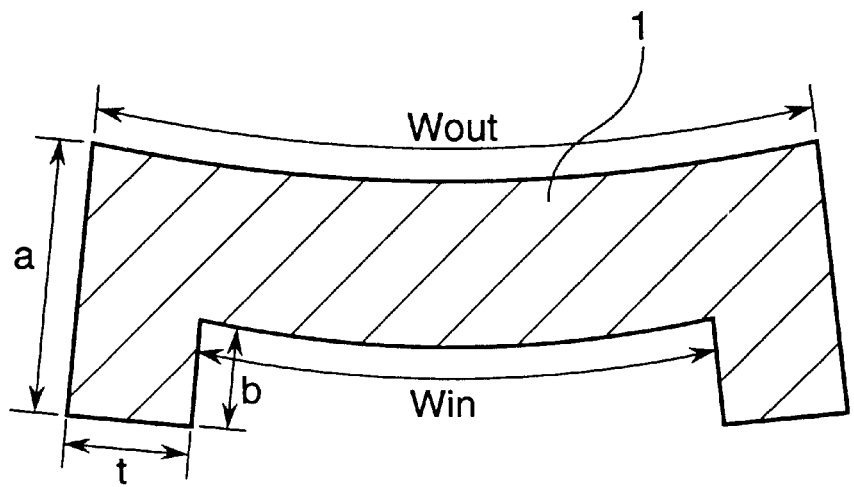
FIG. 3 is a diagrammatic vertical sectional view illustrating the mold cap in a deformed condition.

Now, an advantage of the first embodiment will be described with reference to FIG. 3 which is a diagrammatic sectional view illustrating an imaginary mold cap in a deformed condition.

Similarly to the prior art example mentioned hereinbefore, it is defined that an outer wall surface length "Lout" of the mold cap 1 is expressed by "2a+Wout" where "Wout" designates an outer wall width, and an inner wall surface length "Lin" of the mold cap 1 is expressed by "2b+Win" where "Win" designates an inner wall width. Due to temperature variation, a difference occurs in a linear expansion length between the outer wall surface length "Lout" and the inner wall surface length "Lin". This difference in the linear expansion length causes a thermal stress which deforms the mold cap 1, for example as shown in FIG. 3 when the temperature drops, with the result that a crack often occurs in the mold cap or a bond strength between the mold cap and the mold case significantly drops.

Here, it would be noted that, the larger the difference between the outer wall surface length "Lout" and the inner wall surface length "Lin" is, the larger the difference which occurs in the linear expansion length between the outer wall surface length "Lout" and the inner wall surface length "Lin" due to temperature variation is. In other word, the smaller the difference between the outer wall surface length "Lout" and the inner wall surface length "Lin" becomes, the smaller the difference which occurs in the linear expansion length between the outer wall surface length "Lout" and the inner wall surface length "Lin" due to temperature variation becomes. In this embodiment, the mold cap 1 is constructed to fulfill the relation of a-b≧t and a-b≦b. This makes small the difference between the outer wall surface length "Lout" and the inner wall surface length "Lin", while maintaining a required structural strength of the mold cap. Therefore, it becomes possible to minimize the difference occurring in the linear expansion length between the outer wall surface length "Lout" and the inner wall surface length "Lin" caused due to temperature variation. As a result, it is possible to minimize the deform of the mold cap, thereby to prevent the crack from occurring in the mold cap due to the thermal stress and also to prevent the bond strength between the mold cap and the mold case from significantly dropping due to the deform of the mold cap.

Figure 4:
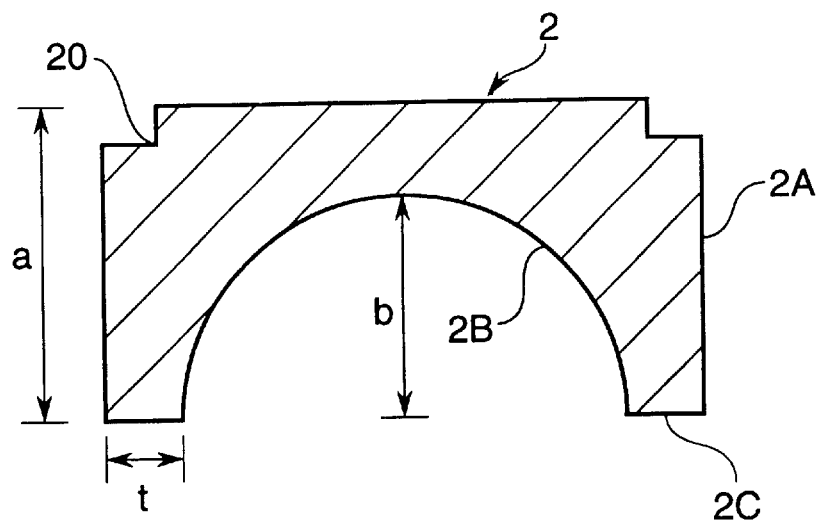
FIG. 4 is a diagrammatic vertical sectional view, taken along the line IV—IV in FIG. 4A, of a second embodiment of the mold cap in accordance with the present invention for a semiconductor device mold package.
Figure 4A:
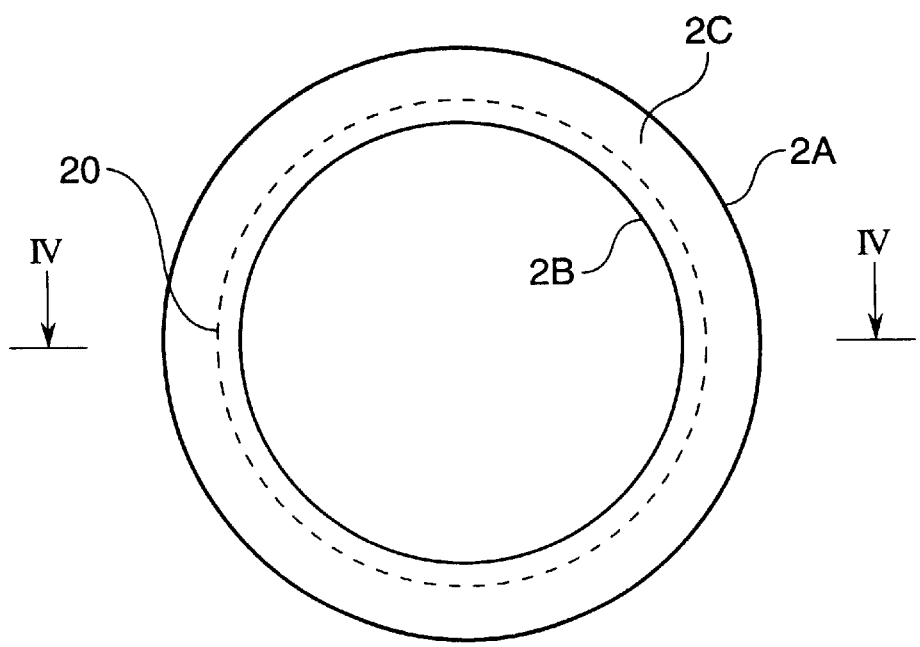
FIG. 4A is a diagrammatic bottom view of the second embodiment of the mold cap shown in FIG. 4.

Referring to FIG. 4, there is shown a diagrammatic sectional view, taken along the line IV—IV in FIG. 4A passing through a center of the mold cap, of a second embodiment of the mold cap for a semiconductor device mold package, in accordance with the present invention. FIG. 4A is a diagrammatic bottom view of the second embodiment of the mold cap shown in FIG. 4.

In the second embodiment, the mold cap is shaped to draw a quadrilaterals in a vertical section and a circle or an ellipse in a bottom view, and has a downward open recess, similarly to the first embodiment. In the vertical section, an outer wall surface of the mold cap draws a quadrilaterals, similarly to the first embodiment, but an inner wall surface of the mold cap also draws a smoothed curve line such as a portion of a circle or an ellipse.

In the shown second embodiment, the mold cap is generally designated with Reference Numeral 2, and generally draws a rectangle in a vertical section as shown in FIG. 4 and a circle in a bottom view, as shown in FIG. 4A. In the vertical section shown in FIG. 4, an outer wall surface 2A of the mold cap 1 draws three sides of a rectangle, and an inner wall surface 2B of the mold cap 1 also draws a partial circle.

The outer wall surface 2A and the inner wall surface 2B are joined at a flat bottom or a flat mouth portion 2C. Similarly to the first embodiment, in the bottom view shown in FIG. 4A, the flat mouth portion 2C has an outer contour in the form of a circle, and an inner contour in the form of a circle, which is coaxially to and is smaller than the circle of the outer contour of the flat mouth portion 2C. Thus, the inner wall surface 2B confines a recess in the form of a partial spherical body.

Here, it is defined that a height from the mouth portion 2C to a top of the outer wall surface 2A is "a", a height from the mouth portion 2C to a top of the inner wall partial spherical surface 2B is "b", and a thickness of the mold cap at the mouth portion 2C is "t". The mold cap 2 is constructed and shaped to fulfill the relation of a-b≧t and a-b≦b, similarly to the first embodiment.

With this arrangement, a gas encapsulated in the inner space of the semiconductor device mold package assumes a partial spherical body, which, as a matter of course, has a volume smaller than that of the cylindrical space in the first embodiment. Therefore, expansion of the gas encapsulated in the inner space of the semiconductor device mold package caused when an ambient temperature elevates, is minimized, and therefore, it is possible to prevent the mold cap from being blown away when the ambient temperature elevates.

In addition, in order to minimize the deform of the mold cap 2 caused by the thermal stress, an upper edge between the outer top surface and the outer side surface of the mold cap can be chamfered as designated by Reference Numeral 20, as shown in FIG. 4.

The invention has thus been shown and described with reference to the specific embodiments. However, it should be noted that the present invention is in no way limited to the details of the illustrated structures but changes and modifications may be made within the scope of the appended claims.

What is claimed is:

1. A semiconductor device mold package comprising:
   a mold cap having a recess defined by an inner wall surface and surrounded by a mouth portion, a height from the mouth portion to a top of an outer wall surface being defined as "a", the mouth portion forming a right angle with the outer wall surface, a height from the mouth portion to a top of the inner wall surface being defined as "b", and a thickness of the mold cap at the mouth portion being defined as "t", the mold cap being constructed to fulfill a relation of a-b≧t and a-b<b;
   a mold case joined to the mold cap to form a hollow closed space that encapsulates a gas therein; and
   a lead frame supporting a semiconductor chip that is contained in the closed space,
   wherein the lead frame extends through a wall of the mold case.

2. The semiconductor device mold package claimed in claim 1 wherein said mold cap is shaped to have a vertical cross section passing through a center of the mold cap in which (1) said inner wall surface of said mold cap defines three sides of a quadrilateral, and (2) said outer wall surface of said mold cap defines three sides of a quadrilateral.

3. The semiconductor device mold package claimed in claim 1 wherein said mold cap is shaped to have a vertical cross section passing through a center of the mold cap in which (1) said inner wall surface of said mold cap defines three sides of a rectangle, and (2) said outer wall surface of said mold cap defines three sides of a rectangle.

4. The semiconductor device mold package claimed in claim 3,
   wherein said mouth portion has a circular outer contour, and a circular inner contour which is coaxial to said outer contour;
   wherein said mold cap is cylindrically shaped; and
   wherein said recess is cylindrically shaped.

5. The semiconductor device mold package claimed in claim 1 wherein said mold cap is shaped to have a vertical cross section passing through a center of the mold cap in which (1) said inner wall surface of said mold cap defines a smoothed curve line, and (2) said outer wall surface of said mold cap defines three sides of a quadrilateral.

6. The semiconductor device mold package claimed in claim 5 wherein said outer wall surface has an upper chamfered corner.

7. The semiconductor device mold package claimed in claim 1 wherein said mold cap is shaped to have a vertical cross section passing through a center of the mold cap in which (1) said inner wall surface of said mold cap defines a portion of a circle, and (2) said outer wall surface of said mold cap defines three sides of a quadrilateral.

8. The semiconductor device mold package claimed in claim 7 wherein said outer wall surface has an upper chamfered corner.

9. The semiconductor device mold package claimed in claim 8,
   wherein said mouth portion has a circular outer contour, and a circular inner contour which is coaxial to said outer contour;
   wherein said mold cap is cylindrically shaped; and
   wherein said recess is cylindrically shaped.

* * * * *